US009865611B2

(12) United States Patent
Sinha (10) Patent No.: US 9,865,611 B2
(45) Date of Patent: Jan. 9, 2018

(54) MULTI-TIERED SEMICONDUCTOR DEVICES AND ASSOCIATED METHODS (71) Applicant: Micron Technology, Inc., Boise, ID (US)

(72) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/867,914

(22) Filed: Sep. 28, 2015

(65) Prior Publication Data

US 2016/0020218 A1 Jan. 21, 2016

Related U.S. Application Data (62) Division of application No. 14/274,933, filed on May 12, 2014, now Pat. No. 9,147,691, which is a division of application No. 13/165,546, filed on Jun. 21, 2011, now Pat. No. 8,722,525.

(51) Int. Cl.
*H01L 21/311* (2006.01)
*H01L 27/06* (2006.01)
*H01L 27/11556* (2017.01)
*H01L 29/788* (2006.01)
*H01L 29/786* (2006.01)

(52) U.S. Cl.
CPC ... *H01L 27/11556* (2013.01); *H01L 21/31111* (2013.01); *H01L 21/31144* (2013.01); *H01L 27/0688* (2013.01); *H01L 29/7889* (2013.01); *H01L 29/78642* (2013.01)

(58) Field of Classification Search
None
See application file for complete search history.

(56) References Cited

U.S. PATENT DOCUMENTS

| 4,553,314 | A | 11/1985 | Chan et al. |
| 6,441,490 | B1 | 8/2002 | Ngo et al. |
| 6,472,327 | B2 | 10/2002 | Ko et al. |
| 8,026,136 | B2 | 9/2011 | Shih et al. |
| 8,237,213 | B2 | 8/2012 | Liu |
| 8,283,662 | B2 | 10/2012 | Saito |
| 8,329,536 | B2 | 12/2012 | Noda |
| 8,722,525 | B2 | 5/2014 | Sinha |
| 9,147,691 | B2 | 9/2015 | Sinha |
| 2009/0057755 | A1 | 3/2009 | Dyer et al. |
| 2010/0171180 | A1 | 7/2010 | Zhang et al. |

(Continued)

OTHER PUBLICATIONS

Jang, J., et al., "Vertical cell array using TCAT(Terabit Cell Array Transistor) technology for ultra high density NAND flash memory", Symposium on VLSI Technology, (2009), 192-193.

(Continued)

*Primary Examiner* — Alexander Ghyka
(74) *Attorney, Agent, or Firm* — Schwegman Lundberg & Woessner, P.A.

(57) ABSTRACT

Methods of fabricating multi-tiered semiconductor devices are described, along with apparatus and systems that include them. In one such method, a first dielectric is formed, and a second dielectric is formed in contact with the first dielectric. A channel is formed through the first dielectric and the second dielectric with a first etch chemistry, a void is formed in the first dielectric with a second etch chemistry, and a device is formed at least partially in the void in the first dielectric. Additional embodiments are also described.

17 Claims, 11 Drawing Sheets

(56) References Cited

U.S. PATENT DOCUMENTS

2011/0149656 A1 6/2011 Tang et al.
2012/0326221 A1 12/2012 Sinha
2014/0246716 A1 9/2014 Sinha

OTHER PUBLICATIONS

Tanaka, H., et al., "Bit Cost Scalable Technology with Punch and Plug Process for Ultra High Density Flash Memory", IEEE Symposium on VLSI Technology, (2007), 14-15.

MULTI-TIERED SEMICONDUCTOR DEVICES AND ASSOCIATED METHODS

PRIORITY APPLICATION

This application is a divisional of U.S. application Ser. No. 14/274,933, filed May 12, 2014, which is a divisional of U.S. application Ser. No. 13/165,546, filed Jun. 21, 2011, now issued as U.S. Pat. No. 8,722,525, all of which are incorporated herein by reference in their entirety.

BACKGROUND

Non-volatile semiconductor memories (NVSMs) are widely used in many electronic devices such as personal digital assistants (PDAs), laptop computers, mobile phones and digital cameras. Some of these memories have arrays of charge storage transistors, such as floating gate transistors.

BRIEF DESCRIPTION OF THE DRAWINGS

Some embodiments are illustrated by way of example and not limitation in the figures of the accompanying drawings in which.

DETAILED DESCRIPTION

An array of charge storage devices according to various embodiments of the invention may function as an array of memory cells in a memory device such as a not AND (NAND) memory device.

Figure 1:
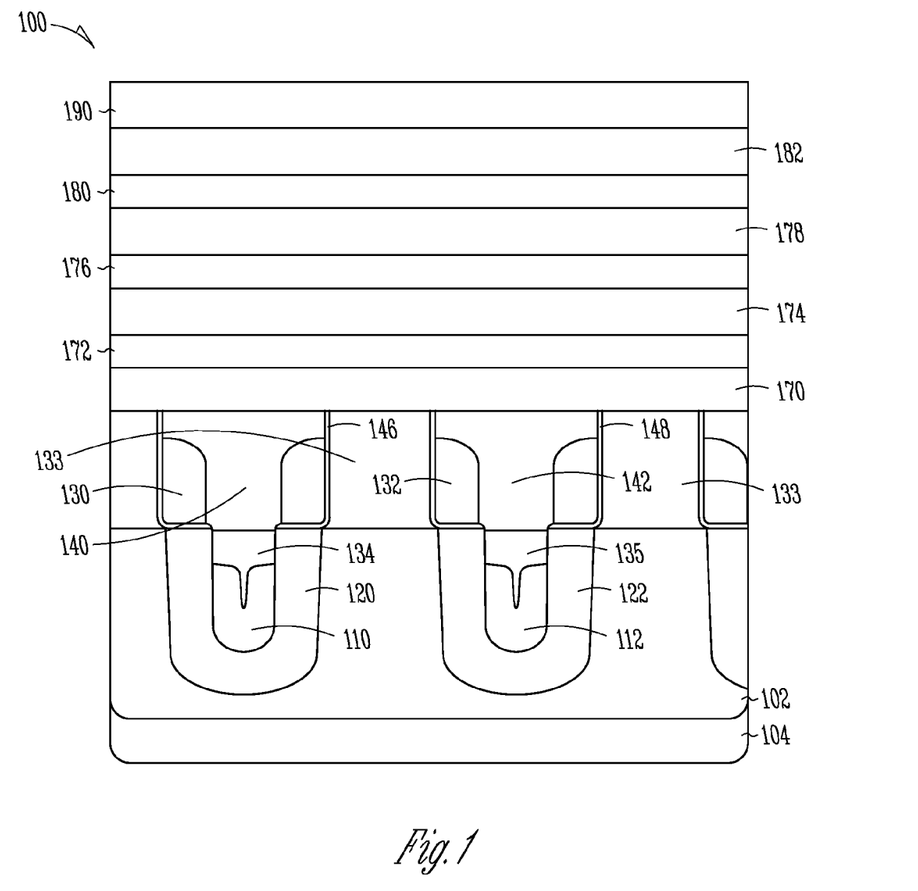
FIG. 1 is a cross-sectional side view of a semiconductor construction according to various embodiments of the invention.

FIG. 1 is a cross-sectional side view of a semiconductor construction 100 according to various embodiments of the invention. Elements in the semiconductor construction 100 will be identified by the same reference numerals throughout the drawings for purposes of brevity and clarity. In addition, acts may be described herein related to the formation of a single device, while the figures include illustrations of multiple devices. Thus, it is understood that the acts described herein may be applied to multiple devices, such as an array of devices, as well.

The semiconductor construction 100 can be formed in a p-type well 102 as part of a substrate 104, which may comprise silicon. In some embodiments, buried source contact lines 110 and 112 lie inside respective lightly doped n-type drains 120 and 122, and the lightly doped n-type drains 120 and 122 can be formed in the p-type well 102. Dual gate select gate sources 130 and 132 in the p-type well 102 can be coupled to a common source line (not shown). The dual gate select gate sources 130 and 132 can be multigate metal oxide semiconductor field effect transistors (MOSFETs) with respective epitaxial silicon channels 133 in the p-type well 102 according to various embodiments of the invention.

Dielectrics 134 and 135 are deposited on the source contact lines 110 and 112 inside the n-type drains 120 and 122. Additional dielectrics 140 and 142 are deposited on the dielectrics 134 and 135 between the dual gate select gate sources 130 and 132. The dielectrics 134, 135, 140 and 142 can be silicon dioxide ($SiO_2$) deposited by high density plasma (HDP) deposition or chemical vapor deposition (CVD) or spin-on deposition. Barriers 146 and 148 of silicon nitride ($Si_3N_4$) are between the dual gate select gate sources 130 and 132 from the n-type drains 120 and 122 and the epitaxial silicon channels 133. The barriers 146 and 148 are from 100 to 200 nanometers thick.

Alternate portions of a high-temperature (HT) dielectric and a low-temperature (LT) dielectric can be formed on the substrate 104 over all of the features formed in the p-type well 102 described above. The LT dielectric may be substantially removed during fabrication of the semiconductor construction 100.

For example, a first HT dielectric 170 may be formed on the substrate 104. A first LT dielectric 172 may then be formed on the first HT dielectric 170. A second HT dielectric 174 may then be formed on the first LT dielectric 172. A second LT dielectric 176 may then be formed on the second HT dielectric 174. A third HT dielectric 178 may then be formed on the second LT dielectric 176. A third LT dielectric 180 may then be formed on the third HT dielectric 178. A fourth HT dielectric 182 may then be formed on the third LT dielectric 180. A polysilicon mask 190 may then be formed on the fourth HT dielectric 182. Substantial portions of the HT dielectrics 170, 174, 178 and 182 may remain after the LT dielectrics 172, 176 and 180 can be removed as will be described below.

Alternatively, the formation of the HT and LT dielectrics on the substrate 104 may be reversed. For example, an LT dielectric may be formed directly on the substrate 104 and then HT dielectrics and LT dielectrics may be formed alternately according to various embodiments of the invention.

The LT dielectrics 172, 176 and 180 may have a substantially higher wet etch rate than the HT dielectrics 170, 174, 178 and 182 to enable a wet etch to remove substantially all of the LT dielectrics 172, 176 and 180 while leaving substantially all of the HT dielectrics 170, 174, 178 and 182 in the semiconductor construction 100. The HT dielectrics 170, 174, 178 and 182 may be, for example, high density plasma (HDP) silicon dioxide deposited when the semiconductor construction 100 is between approximately 500 and 600 degrees Celsius according to various embodiments of the invention. The HDP silicon dioxide has a low wet etch rate when compared with the LT dielectrics 172, 176 and 180.

The LT dielectrics 172, 176 and 180 may comprise LT silicon dioxide according to various embodiments of the invention. The LT silicon dioxide may be, for example, atomic layer deposition (ALD) silicon dioxide or a plasma enhanced chemical vapor deposition (PECVD) silicon dioxide, or both ALD and PECVD silicon dioxide, deposited when the temperature of the semiconductor construction 100 is less than or equal to 250 degrees Celsius, with a hydrogen (H) or a hydroxyl ion (OH) concentration of greater than 8 percent by weight. The H or OH concentration in the ALD or PECVD silicon dioxide may be, for example, greater than or equal to 10 percent by weight. In some embodiments, the wet etch rate of the ALD or PECVD silicon dioxide will not be affected by a subsequent anneal of the semiconductor construction 100 at a temperature below 700 degrees Celsius or by the deposition of HT dielectric.

The HT dielectrics 170, 174, 178 and 182 can have a concentration of hydrogen (H) or a hydroxyl ion (OH) from approximately zero or a trace amount up to one tenth (1/10) of the concentration of hydrogen (H) or a hydroxyl ion (OH) in the LT dielectrics 172, 176 and 180. For the purposes of this document, a trace amount of a material is an amount of material that is detectable but not able to be quantified. The substantial difference in the concentration of hydrogen (H) or a hydroxyl ion (OH) enables the LT dielectrics 172, 176 and 180 to have a substantially higher wet etch rate than the HT dielectrics 170, 174, 178 and 182.

Figure 2:
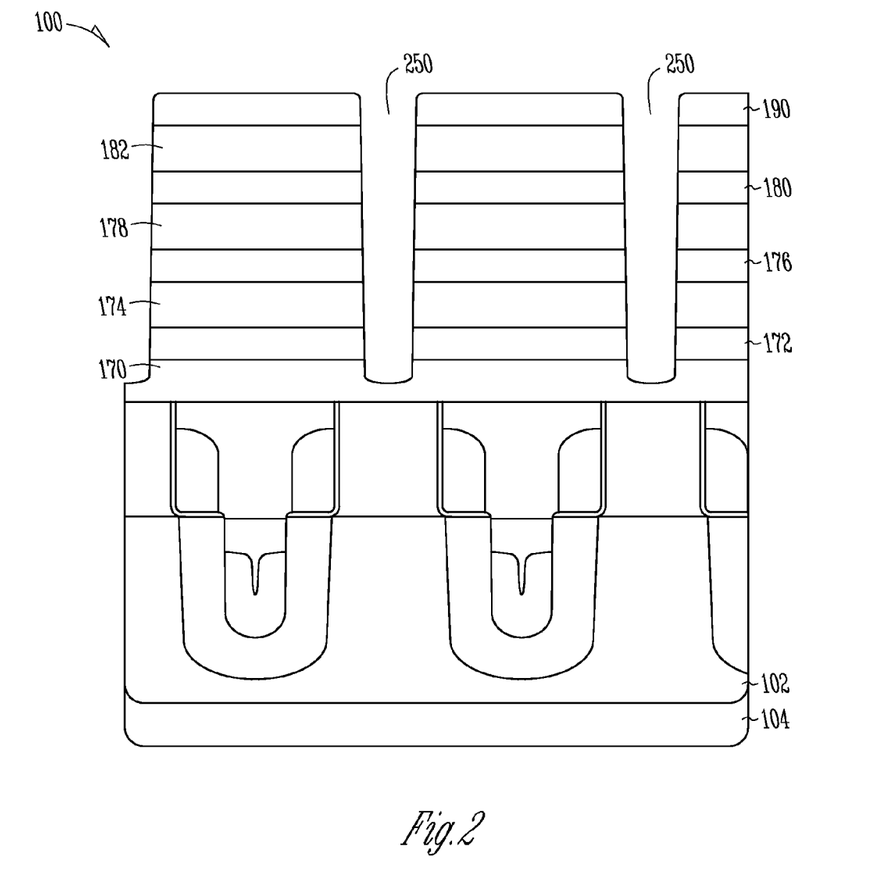
FIG. 2 is a cross-sectional side view of a semiconductor construction according to various embodiments of the invention.

FIG. 2 is a cross-sectional side view of the semiconductor construction 100 according to various embodiments of the invention. Two vertical channels 250 can be etched through the polysilicon mask 190, the HT dielectrics 174, 178 and 182 and the LT dielectrics 172, 176 and 180. The etch of the vertical channels 250 ends in the first HT dielectric 170 to leave some of the first HT dielectric 170 on the substrate 104. The vertical channels 250 can be etched by a single dry etch chemistry such as reactive ion etching. The LT dielectrics 172, 176 and 180 have a dry etch rate slightly higher than the dry etch rate of the HT dielectrics 170, 174, 178 and 182 such that slightly more of the LT dielectrics 172, 176 and 180 can be removed by the dry etch when compared with the HT dielectrics 170, 174, 178 and 182.

Figure 3:
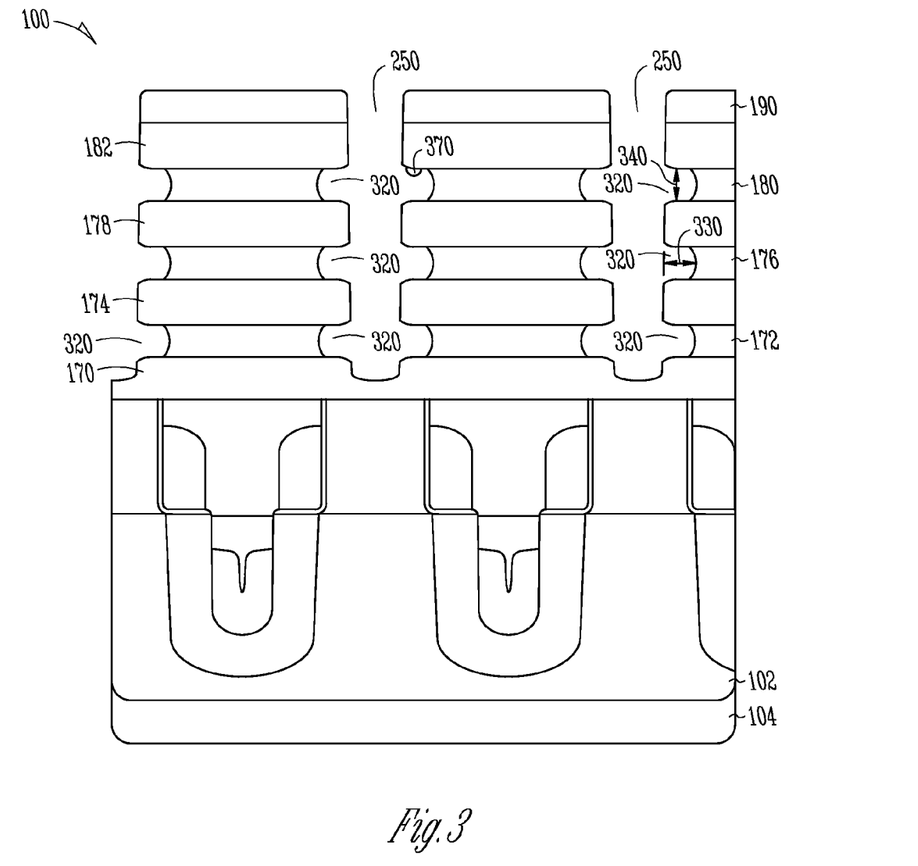
FIG. 3 is a cross-sectional side view of a semiconductor construction according to various embodiments of the invention.

FIG. 3 is a cross-sectional side view of the semiconductor construction 100 according to various embodiments of the invention. The LT dielectrics 172, 176 and 180 can be etched by a single wet etch chemistry applied through the vertical channels 250 to form first voids 320. For example, a controlled time etch with hot phosphoric acid may etch the LT dielectrics 172, 176 and 180 to a specific depth and width. The LT dielectrics 172, 176 and 180 have a wet etch rate that is substantially higher than the wet etch rate of the HT dielectrics 170, 174, 178 and 182 such that substantially all of the HT dielectrics 170, 174, 178 and 182 remain after the first voids 320 can be formed. The first voids 320 have a depth 330 and a width 340, and devices may be formed at least partially in the first voids 320. The devices may be memory cells or diodes such as metal-insulator-metal (MIM) diodes or polysilicon diodes.

The LT dielectrics 172, 176 and 180 may be LT silicon nitride and the HT dielectrics 170, 174, 178 and 182 may be HT silicon nitride according to various embodiments of the invention. The HT silicon nitrides 170, 174, 178 and 182 can be PECVD silicon nitrides deposited when the temperature of the semiconductor construction 100 is approximately 550 degrees Celsius. The LT silicon nitrides 172, 176 and 180 can be PECVD silicon nitrides deposited when the temperature of the semiconductor construction 100 is less than or equal to 250 degrees Celsius with a H or OH concentration of greater than or equal to 8 percent by weight. The H or OH concentration in the PECVD silicon nitride may be, for example, greater than or equal to 10 percent by weight.

The wet etch rate of LT silicon nitride can be determined in part by the high temperatures to which the LT silicon nitride can be exposed and the length of time of the exposure to the high temperatures. To illustrate, the LT silicon nitride 172 can be formed earlier than the LT silicon nitride 176, and the LT silicon nitride 176 can be formed earlier than the LT silicon nitride 180. Therefore, the LT silicon nitride 172 can be subject to high temperatures for a longer period of time than the other LT silicon silicon nitrides 176 and 180, and the LT silicon nitride 176 can be subject to high temperatures longer than the LT silicon nitride 180. To compensate, LT silicon nitrides higher in the semiconductor construction 100 can be deposited at higher temperatures such that the LT silicon nitrides 172, 176 and 180 have the same wet etch rate. More specifically, the LT silicon nitride 180 can be deposited at a higher temperature than the LT silicon nitride 176 below it, and the LT silicon nitride 176 can be deposited at a higher temperature than the LT silicon nitride 172 below it.

Residual LT dielectric 370, such as residual silicon nitride or residual silicon dioxide, may remain on the semiconductor construction 100 after the wet etch process. For example, the residual LT dielectric 370 may remain on one or more of the HT dielectrics 170, 174, 178 and 182. The residual LT dielectric 370 may be a trace amount of dielectric.

The semiconductor construction 100 with HT silicon nitrides and LT silicon nitrides can be etched in a manner similar to the semiconductor construction 100 with HT silicon dioxides and LT silicon dioxides, although the dry etch and wet etch chemistries and temperatures may be different.

Figure 4:
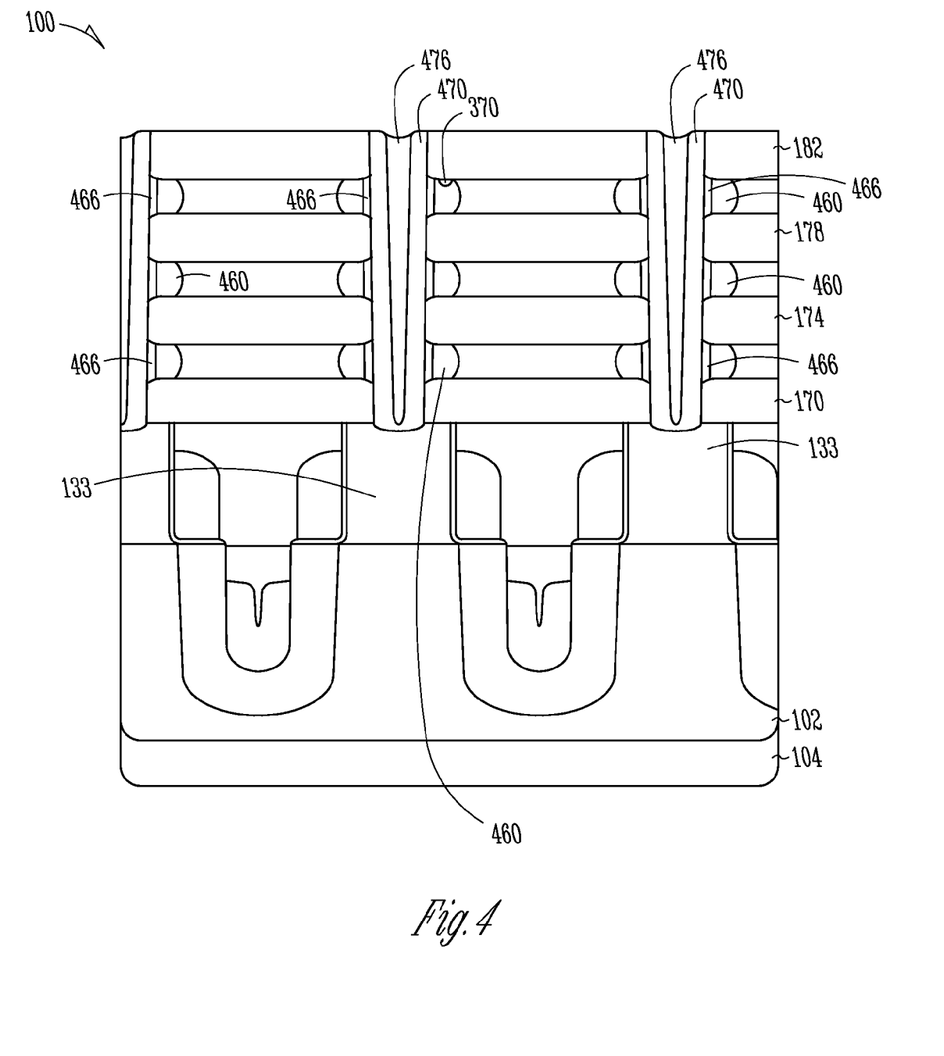
FIG. 4 is a cross-sectional side view of a semiconductor construction according to various embodiments of the invention.

FIG. 4 is a cross-sectional side view of the semiconductor construction 100 according to various embodiments of the invention. The polysilicon mask 190 is removed. Charge storage structures, such as polysilicon floating gates 460, can be formed in the first voids 320. The polysilicon floating gates 460 may be formed in one of several ways. For example, polysilicon can be deposited to fill the vertical channels 250, and the polysilicon can be then etched by a blanket silicon etch to leave only the polysilicon floating gates 460 in the first voids 320. The depth 330 and the width 340 of the first voids 320 determine the thickness of devices formed therein. Residual silicon in each of the first voids 320 can be oxidized to form gate dielectrics 466 on the floating gates 460, such as to separate each of the filled first voids 320 from the vertical channels 250.

Thin film transistor (TFT) channels 470 can be formed by depositing a TFT polysilicon spacer in each of the vertical channels 250. The TFT channels 470 each include an air gap 476 to address electrical interference. The air gap 476 may be filled with polysilicon or silicon dioxide, for example, according to various embodiments of the invention. The TFT channels 470 may be formed by punching or etching through the HT dielectric 170 into the epitaxial silicon channels 133, and depositing a thin TFT to strap the TFT polysilicon spacer to the epitaxial silicon channels 133.

Figure 5:
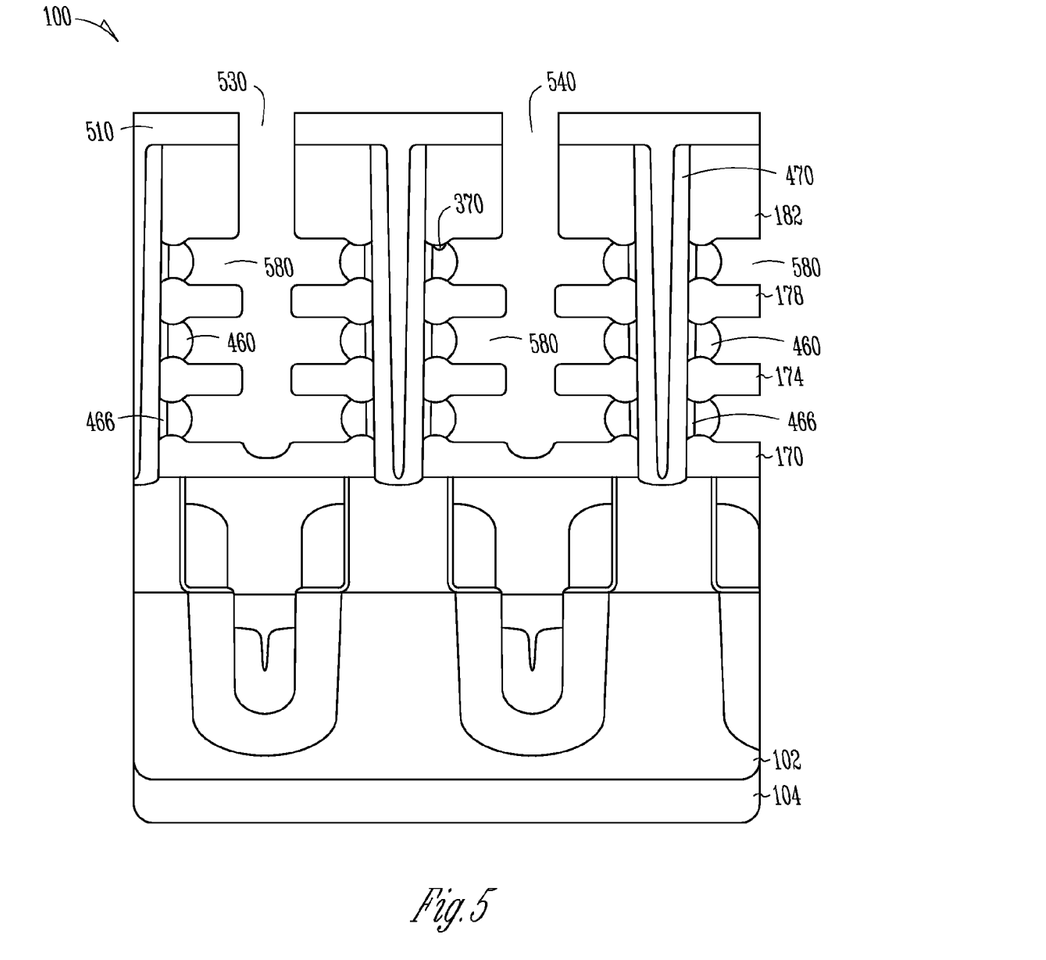
FIG. 5 is a cross-sectional side view of a semiconductor construction according to various embodiments of the invention.

FIG. 5 is a cross-sectional side view of the semiconductor construction 100 according to various embodiments of the invention. Silicon dioxide 510 can be formed on the semiconductor construction 100 on the fourth HT dielectric 182, the TFT channels 470 and in the air gaps 476. Two vertical channels 530 and 540 can be etched through the silicon dioxide 510, the HT dielectrics 174, 178 and 182 and the LT dielectrics 172, 176 and 180. The etch of the vertical channels 530 and 540 ends in the first HT dielectric 170, leaving some of the first HT dielectric 170 on the substrate 104. The vertical channels 530 and 540 can be etched by a dry etch chemistry such as reactive ion etching.

Remaining portions of the LT dielectrics 172, 176 and 180 can be etched by a single wet etch chemistry through the vertical channels 530 and 540 to form second voids 580. For example, a controlled time etch with hot phosphoric acid may etch the LT dielectrics 172, 176 and 180. Substantially all of the HT dielectrics 170, 174, 178 and 182 remain after the second voids 580 are formed. The floating gates 460 formed in the first voids 320 can be exposed by the removal of the LT dielectrics 172, 176 and 180.

Portions of the HT dielectrics 170, 174, 178 and 182 around each floating gate 460 may be removed to increase the size of the second voids 580 into which blocking dielectrics will be formed and to reduce an operating voltage of subsequently formed control gates (not shown) according to various embodiments of the invention.

Figure 6:
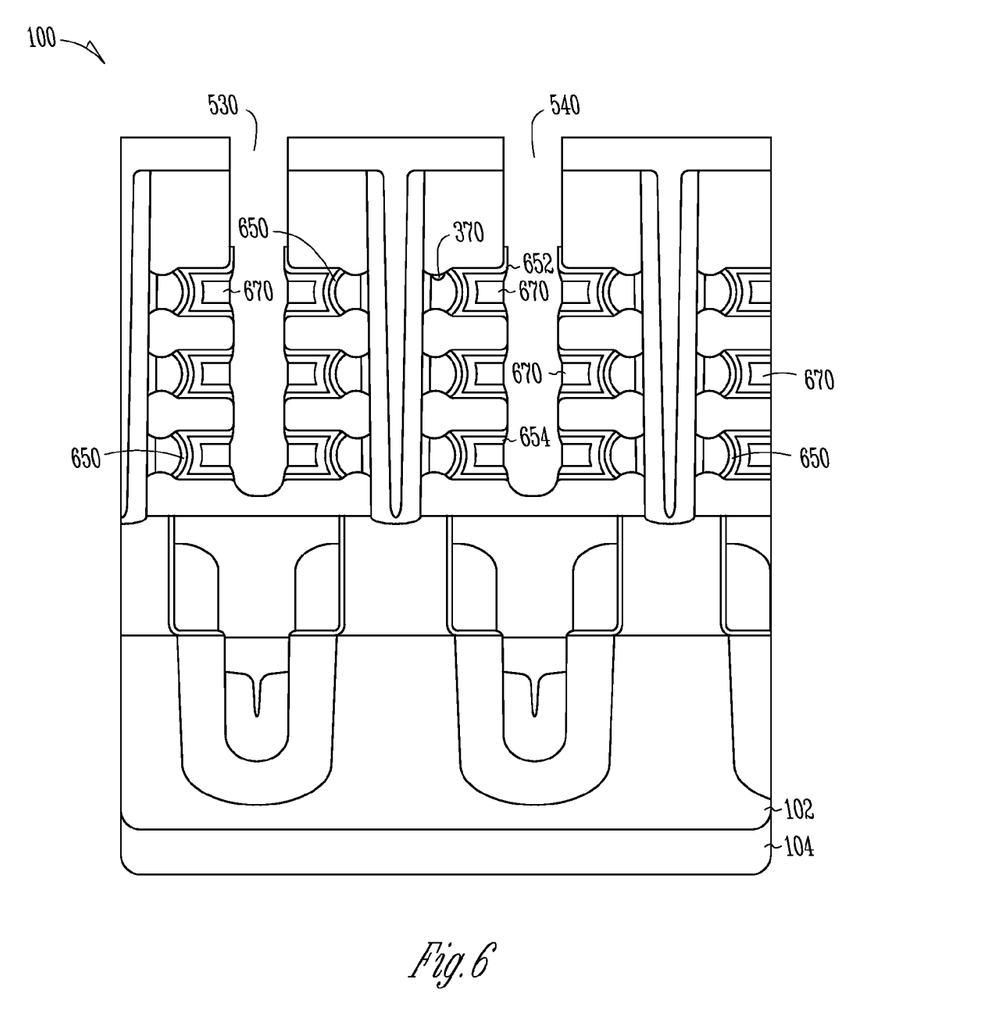
FIG. 6 is a cross-sectional side view of a semiconductor construction according to various embodiments of the invention.

FIG. 6 is a cross-sectional side view of the semiconductor construction 100 according to various embodiments of the invention. Residual silicon in the second voids 580 between the HT dielectrics 170, 174, 178 and 182 can be oxidized to form silicon dioxide 650 on the floating gates 460. Silicon nitride 652 and silicon dioxide 654 can be formed on the silicon dioxide 650 to form a blocking dielectric of oxide-nitride-oxide ($SiO_2Si_3N_4SiO_2$ or ONO). A conductive material, such as metal or silicon, or a conductive metal nitride such as titanium nitride (TiN), can be deposited in the second voids 580 between the ONO 650, 652 and 654 to form control gates 670. The control gates 670 may also be, for example, NiSi, Ru, Si, TaN, Ti, TiSi, W, WN, or $WSi_x$ according to various embodiments of the invention. A blanket etch may be performed to separate the control gates 670 from each other and to substantially reestablish openings 530 and 540.

Figure 7:
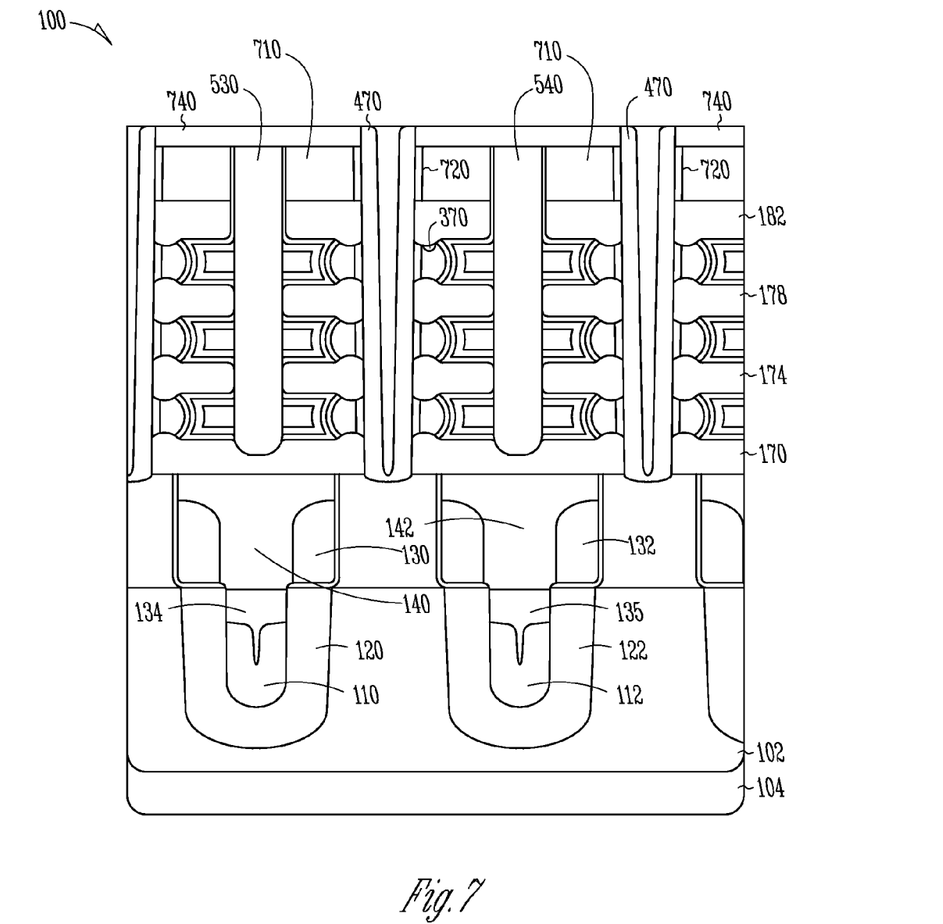
FIG. 7 is a cross-sectional side view of a semiconductor construction according to various embodiments of the invention.

FIG. 7 is a cross-sectional side view of the semiconductor construction 100 according to various embodiments of the invention. The substantially reestablished openings 530 and 540 can be filled with silicon dioxide. Select gate drain (SGD) regions 710 can be formed on the fourth HT dielectric 182 between the silicon dioxide in the openings 530 and 540 and the TFT channels 470. The SGD regions 710 can be separated from the TFT channels 470 by dielectrics 720. Silicon dioxide 740 can be formed on the SGD regions 710 and the dielectrics 720.

In some embodiments of the invention, the HT dielectric 170 may not be a part of the semiconductor construction 100. The silicon dioxide in the openings 530 and 540 can extend into the dielectrics 140 and 142 and closer to the dual gate select gate sources 130 and 132.

Figure 8:
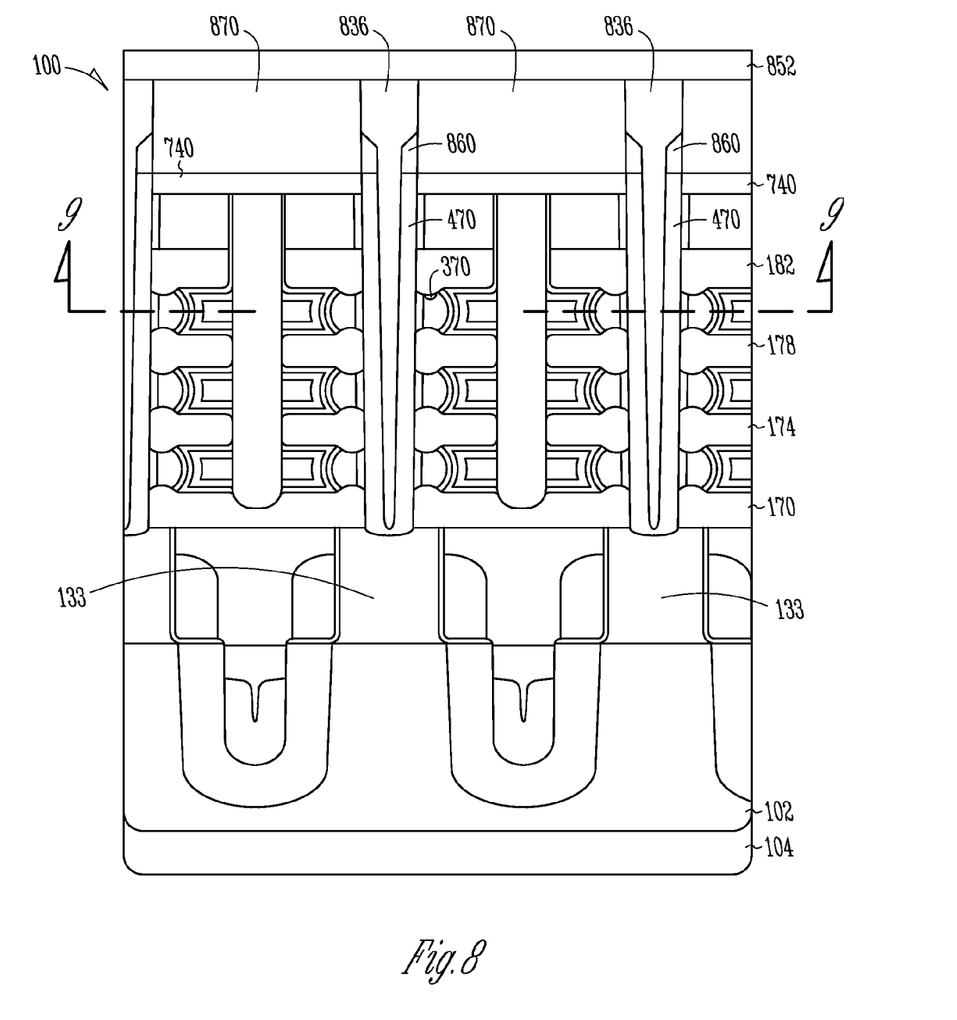
FIG. 8 is a cross-sectional side view of a semiconductor construction according to various embodiments of the invention.

FIG. 8 is a cross-sectional side view of the semiconductor construction 100 according to various embodiments of the invention. Contact plugs 836 can be formed on the TFT channels 470, and a conductive (e.g., metal) data line 852 can be formed above on the contact plugs 836 and the silicon dioxide 740. The contact plugs 836 couple the data line 852 to the respective TFT channels 470. An annular collar 860 is formed around each contact plug 836 between the TFT channel 470 and an angled edge of the contact plug 836. Each contact plug 836 has a diameter that increases above the respective TFT channel 470 at the angled edge. The annular collar 860 can be polysilicon or a metal comprising platinum (Pt), titanium nitride (TiN), Rhodium (Rh), Iridium (Ir), nickel (Ni) or tantalum nitride (TaN) according to various embodiments of the invention. The contact plugs 836 may be shorter such that they do not extend as far into the semiconductor construction 100 as is shown in FIG. 8 according to various embodiments of the invention. Dielectrics 870 are formed between the contact plugs 836 over the silicon dioxide 740. The dielectrics 870 can be undoped silicon dioxide or borophosphosilicate glass (BPSG) or phosphosilicate glass (PSG).

The residual LT dielectric 370 can remain on one or more of the HT dielectrics 170, 174, 178 and 182 in the semiconductor construction 100.

The semiconductor construction 100 shown in FIGS. 1-8 can be an array of vertical NAND strings of memory cells according to various embodiments of the invention. Each NAND string includes one of the TFT channels 470 and multiple charge storage (e.g., floating gate) transistors coupled to the TFT channel 470 between the data line 852 and one of the epitaxial silicon channels 133.

Figure 9:
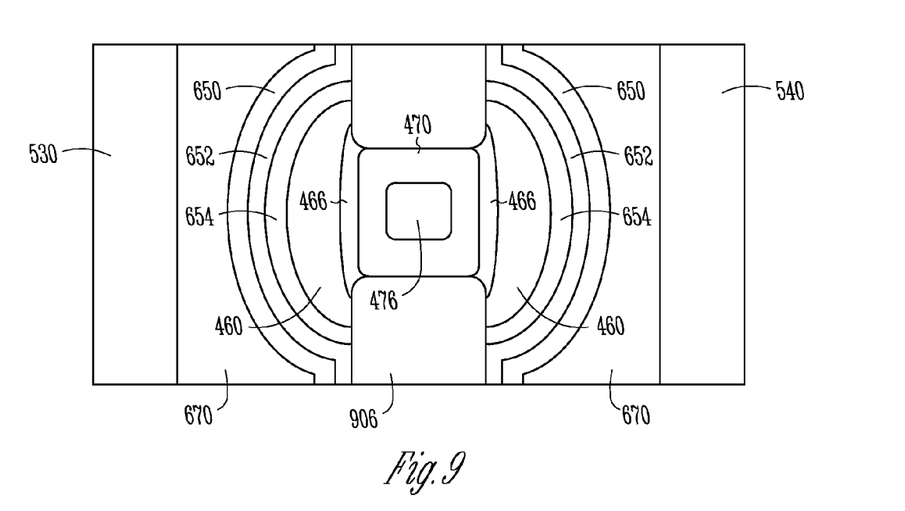
FIG. 9 is a cross-sectional view of a semiconductor construction according to various embodiments of the invention.

FIG. 9 is a cross-sectional view of the semiconductor construction 100, taken along a line 9-9 shown in FIG. 8, according to various embodiments of the invention. Two memory cells are shown in FIG. 9 between the openings 530 and 540. Central in FIG. 9 is one of the TFT channels 470 around the air gap 476. The TFT channel 470 can be polysilicon, for example, and can be separated from two polysilicon floating gates 460 by respective gate dielectrics 466. Silicon dioxide 906 can be formed on two sides of the TFT channel 470 that are not in contact with the gate dielectrics 466. The ONO 650, 652 and 654 can be formed between the polysilicon floating gates 460 and respective control gates 670. The control gates 670 end at the openings 530 and 540 that can be filled with silicon dioxide. Each polysilicon floating gate 460 with the associated gate dielectric 466 and ONO 650, 652 and 654 can be a charge storage transistor that functions as one of the memory cells in the NAND string.

Figure 10:
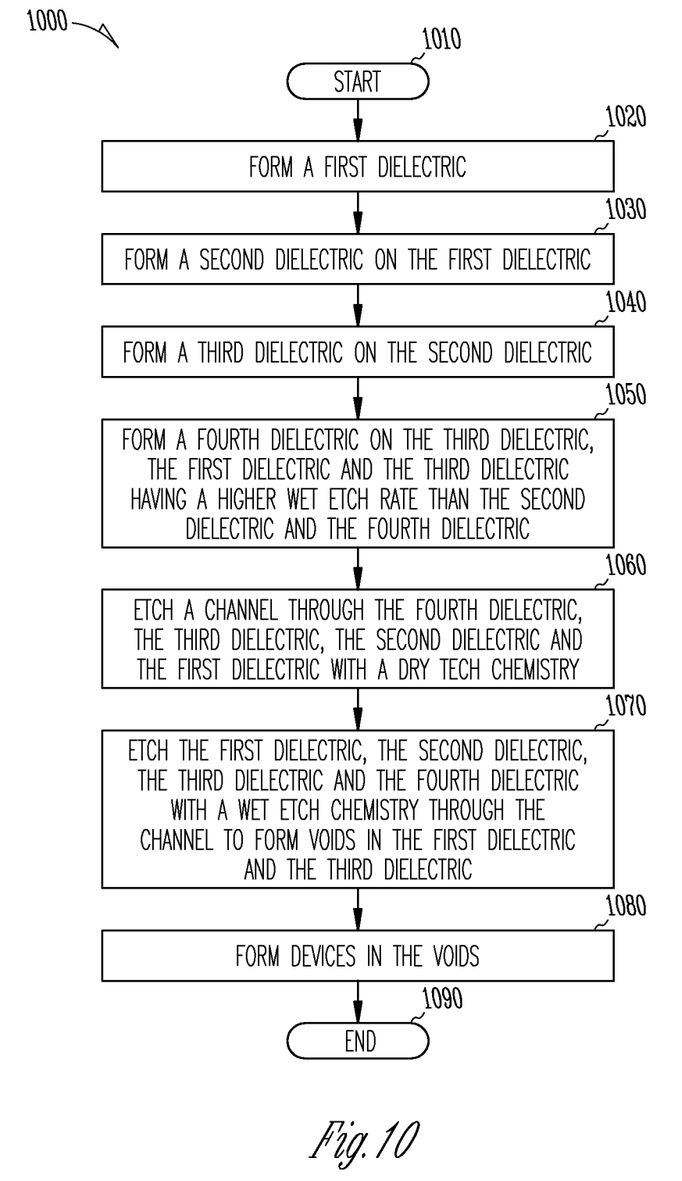
FIG. 10 is a flow diagram of methods according to various embodiments of the invention.

FIG. 10 is a flow diagram of methods 1000 according to various embodiments of the invention. In block 1010, the methods 1000 start. In block 1020, a first dielectric can be formed. In block 1030, a second dielectric can be formed on the first dielectric. In block 1040, a third dielectric can be formed on the second dielectric. In block 1050, a fourth dielectric can be formed on the third dielectric, the first dielectric and the third dielectric having a higher wet etch rate than the second dielectric and the fourth dielectric. In block 1060, a channel can be etched through the fourth dielectric, the third dielectric, the second dielectric and at least a portion of the first dielectric with a dry etch chemistry. In block 1070, the first dielectric, the second dielectric, the third dielectric and the fourth dielectric can be exposed to a wet etch chemistry through the channel to form voids in the first dielectric and the third dielectric. In block 1080, devices can be formed at least partially in the voids. In block 1090, the methods 1000 end. Various embodiments may have more or fewer activities than those shown in FIG. 10. The activities shown may be accomplished in the illustrated order, or in another order. Some activities may be substituted for others.

Multi-tiered semiconductor devices can be expensive to fabricate because it can be difficult to form features in multiple tiers of semiconductor material. The inventors have discovered that the challenge noted above, as well as others, can be addressed by alternately forming a first dielectric and a second dielectric to form a semiconductor construction including a number of first dielectrics interleaved with a number of second dielectrics. A vertical channel can be etched by a single dry etch chemistry leaving a substantially straight profile through the first dielectrics and the second dielectrics. The first dielectrics and the second dielectrics can then be exposed to a single wet etch chemistry such that substantially all of the second dielectrics remain after the wet etch. The wet etch results in voids in the first dielectrics in which devices can be at least partially formed. In one such embodiment, only two etch chemistries are needed to form the channels and the voids.

The semiconductor construction 100 includes three tiers of devices. A greater or lesser number of tiers of devices may be fabricated according to various embodiments of the invention.

Figure 11:
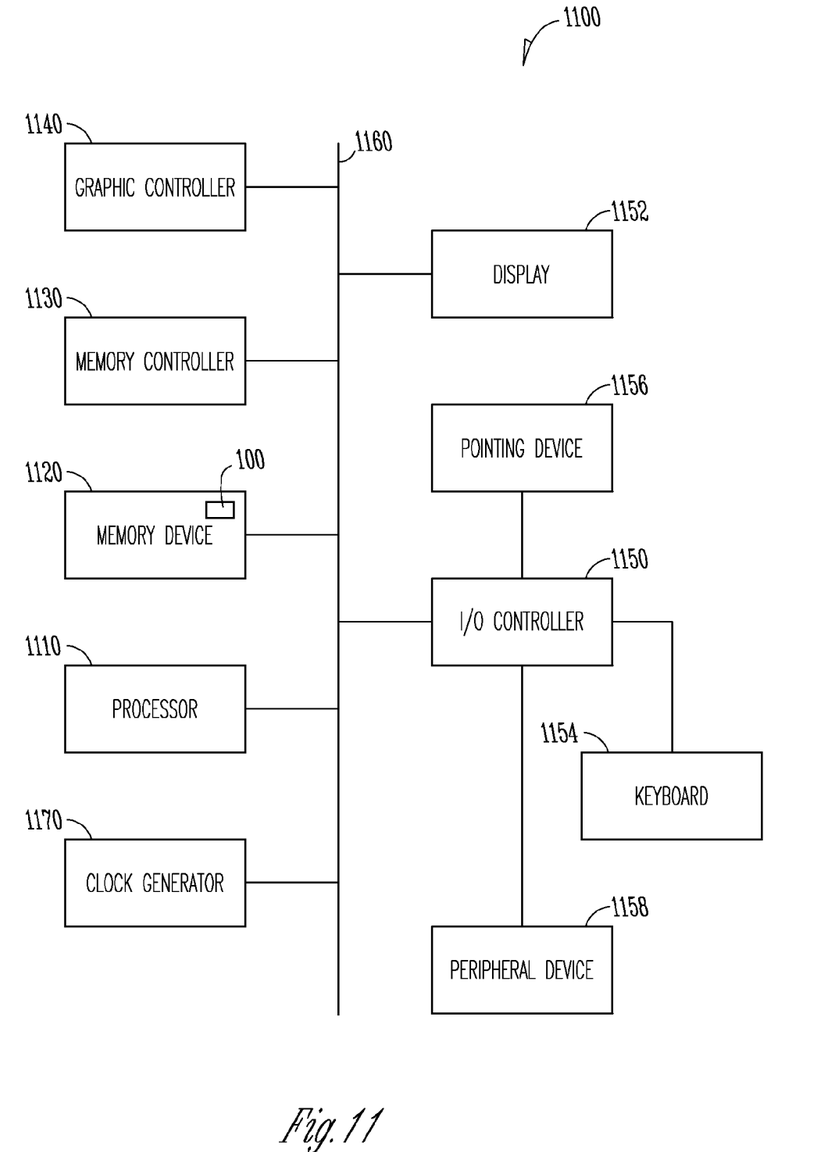
FIG. 11 is a diagram illustrating a system according to various embodiments of the invention.

FIG. 11 is a diagram illustrating a system 1100 according to various embodiments of the invention. The system 1100 may include a processor 1110, a memory device 1120, a memory controller 1130, a graphic controller 1140, an input and output (I/O) controller 1150, a display 1152, a keyboard 1154, a pointing device 1156, and a peripheral device 1158. A bus 1160 couples all of these devices together. A clock generator 1170 can be coupled to the bus 1160 to provide a clock signal to at least one of the devices of the system 1100 through the bus 1160. The clock generator 1170 may include an oscillator in a circuit board such as a motherboard. Two or more devices shown in system 1100 may be formed in a single integrated circuit chip. The memory device 1120 may comprise devices such as an array of vertical NAND strings of memory cells such as, for example, the semiconductor construction 100 described herein and shown in the figures according to various embodiments of the invention. The bus 1160 may be interconnect traces on a circuit board or may be one or more cables. The bus 1160 may couple the devices of the system 1100 by wireless means such as by electromagnetic radiations, for example, radio waves. The peripheral device 1158 coupled to the I/O controller 1150 may be a printer, an optical device such as a CD-ROM and a DVD reader and writer, a magnetic device reader and writer such as a floppy disk driver, or an audio device such as a microphone.

The system 1100 represented by FIG. 11 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio 3) players, video games, watches, etc.), and the like.

Any of the circuits or systems described herein may be referred to as a module. A module may comprise a circuit and/or firmware according to various embodiments.

Example structures and methods of fabricating charge storage transistors have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features can be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
multiple vertically spaced tiers of a first dielectric interleaved with multiple tiers of a second dielectric, with devices formed in the respective tiers of the second dielectric, the devices being disposed between adjacent tiers of the first dielectric; and
wherein the second dielectric has a hydrogen (H) or a hydroxyl ion (OH) concentration of greater than eight percent by weight and a higher wet etch rate than the wet etch rate of the first dielectric.

2. The apparatus of claim 1, wherein:
the first dielectric comprises silicon dioxide formed by a first process; and
the second dielectric comprises silicon dioxide formed by a second process.

3. The apparatus of claim 1, wherein:
the first dielectric comprises silicon nitride formed by a first process; and
the second dielectric comprises silicon nitride formed by a second process.

4. The apparatus of claim 1, further comprising: a semiconductor pillar extending vertically through the tiers of the first dielectric and adjacent the devices.

5. The apparatus of claim 1, wherein the devices each comprise charge storage structure.

6. The apparatus of claim 1, wherein the devices comprise a diode.

7. The apparatus of claim 1, further comprising:
a first void in the multiple tiers of second dielectric;
wherein the device is formed in the first void and includes,
a charge storage structure, and
a dielectric on the charge storage structure.

8. The apparatus of claim 1, wherein:
the first dielectric is a relatively high temperature dielectric; and
the second dielectric is a relatively low temperature dielectric.

9. The apparatus of claim 8, wherein the low temperature dielectric comprises silicon dioxide that was deposited at temperatures less than or equal to 250° C.

10. The apparatus of claim 8, wherein the high temperature dielectric comprises silicon dioxide that was deposited at temperatures between 500°-600° C.

11. The apparatus of claim 8, wherein the low temperature dielectric comprises silicon nitride that was deposited at temperatures less than or equal to 250° C.

12. The apparatus of claim 10, wherein the high temperature dielectric comprises silicon nitride that was deposited at a temperature of approximately 550° C.

13. The apparatus of claim 2, wherein the first oxide dielectric is formed by a high density plasma deposition process.

14. The apparatus of claim 2, wherein the second oxide dielectric is formed by at least one of an atomic layer deposition process and a plasma enhanced chemical vapor deposition process.

15. The apparatus of claim 3, wherein the first nitride dielectric is formed by a plasma enhanced chemical vapor deposition process at a first temperature.

16. The apparatus of claim 15, wherein the second nitride dielectric is formed by a plasma enhanced chemical vapor deposition process at a second temperature that is lower than the first temperature and equal to or less than 250° C.

17. The apparatus of claim 16, wherein a relatively lower tier of the multiple tiers of second nitride dielectric is deposited at a lower temperature than a relatively higher tier of the multiple tiers of second nitride dielectric.

\* \* \* \* \*